(12) United States Patent
Asako

(10) Patent No.: US 12,733,419 B2
(45) Date of Patent: Sep. 8, 2026

(54) SUBSTRATE PROCESSING METHOD AND SUBSTRATE PROCESSING APPARATUS

(71) Applicant: Tokyo Electron Limited, Tokyo (JP)

(72) Inventor: Ryuichi Asako, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 1134 days.

(21) Appl. No.: 17/756,780

(22) PCT Filed: Nov. 30, 2020

(86) PCT No.: PCT/JP2020/044535
§ 371 (c)(1),
(2) Date: Jun. 2, 2022

(87) PCT Pub. No.: WO2021/117534
PCT Pub. Date: Jun. 17, 2021

(65) Prior Publication Data

US 2023/0010867 A1 Jan. 12, 2023

(30) Foreign Application Priority Data

Dec. 12, 2019 (JP) ................................ 2019-224476

(51) Int. Cl.
*H10P 50/28* (2026.01)
*H01J 37/32* (2006.01)

(52) U.S. Cl.
CPC ...... *H10P 50/283* (2026.01); *H01J 37/32449* (2013.01); *H01J 37/32082* (2013.01); *H01J 2237/334* (2013.01)

(58) Field of Classification Search
None
See application file for complete search history.

(56) References Cited

U.S. PATENT DOCUMENTS

2017/0148640 A1* 5/2017 Wang .................. H01L 21/3105
2022/0216050 A1* 7/2022 Yu ..................... H01L 21/31138

FOREIGN PATENT DOCUMENTS

| | | |
|---|---|---|
| JP | H09-190993 | 7/1997 |
| JP | 2013-235912 | 11/2013 |
| JP | 2015-173240 | 10/2015 |
| WO | 2019/054490 | 3/2019 |

* cited by examiner

*Primary Examiner* — Shamim Ahmed
(74) *Attorney, Agent, or Firm* — IPUSA, PLLC

(57) ABSTRACT

A substrate processing method including: a) providing a substrate having a first region on a surface; b) supplying a precursor to the surface of the substrate, the precursor including at least both a halogen and carbon and being configured to form a first chemical bond in the first region; and c) exposing the surface of the substrate to a plasma of an inert gas.

17 Claims, 10 Drawing Sheets

FIG.5

$$CH_2{=}CH{-}(CF_2)_6{-}CH{=}CH_2 + H_2N{-}(Si) \rightarrow CH_2{=}CH{-}(CF_2)_6{-}CH_2{-}CH_2{-}NH{-}(Si) \quad \text{---(1)}$$

SUBSTRATE PROCESSING METHOD AND SUBSTRATE PROCESSING APPARATUS

TECHNICAL FIELD

The present invention relates to a substrate processing method and a substrate processing apparatus.

BACKGROUND ART

PTL 1 discloses a method of etching a region formed of silicon oxide. The method includes: exposing a target object including the region to plasma of a processing gas containing a fluorocarbon gas; forming a deposit containing fluorocarbon on the region; and etching the region with a radical of the fluorocarbon contained in the deposit.

CITATION LIST

Patent Literature

[PTL 1]
Japanese Laid-Open Patent Publication No. 2015-173240

SUMMARY OF INVENTION

Technical Problem

The present disclosure provides a substrate processing method and a substrate processing apparatus capable of performing a selective etching process.

Solution to Problem

In order to solve the above problem, one aspect of the present invention is a substrate processing method including: a) providing a substrate having a first region on a surface; b) supplying a precursor to the surface of the substrate, the precursor including at least both a halogen and carbon and being configured to form a first chemical bond in the first region; and c) exposing the surface of the substrate to a plasma of an inert gas.

Advantageous Effects of Invention

According to one aspect of the present disclosure, a substrate processing method and a substrate processing apparatus capable of performing a selective etching process, can be provided.

BRIEF DESCRIPTION OF THE DRAWINGS

FIG. 5 is a reaction formula representing a chemical reaction in which the precursor forms a chemical bond with a substrate surface;

DESCRIPTION OF EMBODIMENTS

Figure 1:
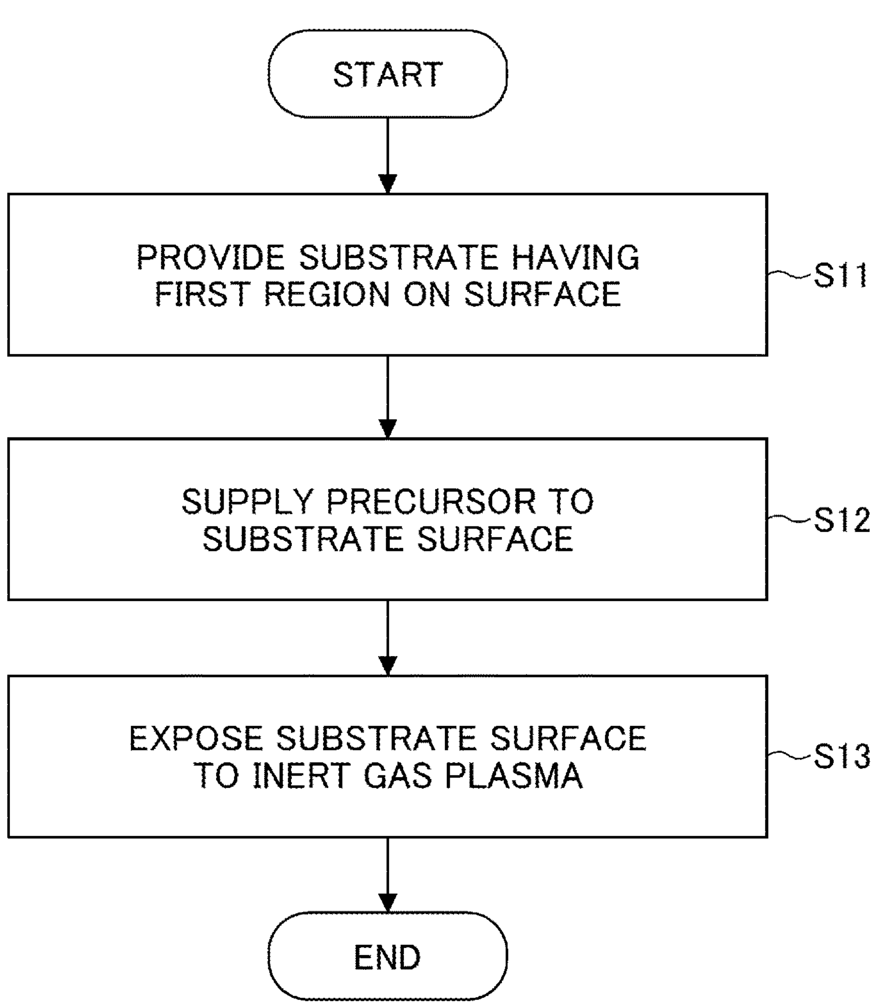
FIG. 1 is a flowchart illustrating an example of a substrate processing method according to the first embodiment.

Hereinafter, embodiments of the present disclosure will be described with reference to the drawings. The description of the parts that are common to each drawing may be omitted with the same or corresponding reference numerals.

<Substrate Processing Method>

The substrate processing method according to the first embodiment will be described with reference to FIG. 1. FIG. 1 is a flowchart illustrating an example of a substrate processing method according to the first embodiment. Here, as an example of the substrate processing method, a method of plasma processing (for example, plasma etching) will be described.

The substrate processing method of the first embodiment includes: a) providing a substrate having a first region on a surface; b) supplying a precursor to the surface of the substrate, the precursor including at least both a halogen and carbon and being configured to form a first chemical bond in the first region; and c) exposing the surface of the substrate to a plasma of an inert gas. In the present disclosure, steps S11 to S13 are performed as illustrated in FIG. 1.

In step S11, a substrate having a first region on a surface is provided. Step S11 is an example of the step of providing a substrate having a first region on a surface in the substrate processing method of the present disclosure.

Figure 2:
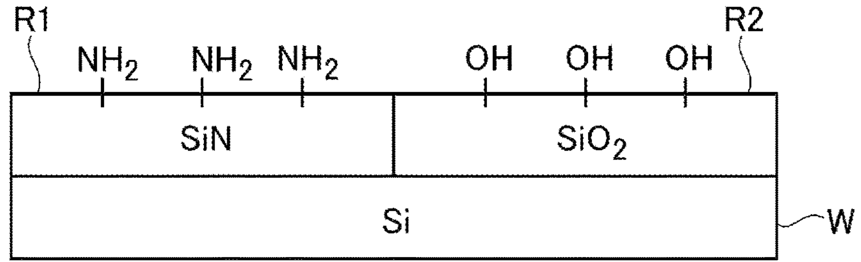
FIG. 2 is an image of a substrate before a precursor is supplied.

As illustrated in FIG. 2, a substrate is denoted by W. The substrate W may be comprised of a semiconductor wafer (hereinafter referred to as a wafer). The substrate W is not limited to wafers, and may be comprised of a glass substrate for manufacturing a flat panel display. As used herein, a substrate is an example of the substrate provided in the substrate processing method of the present disclosure.

The substrate W has a first region R1 and a second region R2 on the surface. The first region R1 and the second region R2 are arranged side by side on a plane when viewed from above the substrate W, as illustrated in FIG. 2. The regions arranged side by side on a plane may be arranged on the same plane or may be arranged on different planes with steps in the thickness direction of the substrate.

The first region R1 and the second region R2 are not limited to the configuration illustrated in FIG. 2. The first region R1 and the second region R2 may be stacked on the surface of the substrate in the vertical direction. The first region R1 and the second region R2 stacked on the surface of the substrate may be disposed on the surface of the substrate such that the stacking direction is perpendicular to the thickness direction of the substrate.

The first region R1 is formed of silicon nitride (SiN) and the second region R2 is formed of silicon oxide ($SiO_2$). The surface (terminal) of the first region formed of silicon nitride is composed of Si—$NH_2$ groups (see FIG. 2) because the extra bond at the terminal tends to bind to hydrogen (H). The surface (terminal) of the second region formed of silicon oxide is composed of Si—OH groups (see FIG. 2) because the extra bond at the terminal tends to bind to a hydroxyl group (OH group).

In step S12, a precursor is supplied to the surface of the substrate (hereinafter referred to as a substrate surface) (see FIGS. 1 and 3). The precursor represents a precursor used in processing of the substrate. In the present disclosure, the precursor includes at least both a halogen and carbon. The halogen included in the precursor is not limited. The halogen is preferably fluorine, chlorine, bromine, iodine, or a mixture of two or more of these, and more preferably fluorine or chlorine.

The component of the precursor is not limited. The precursor may include, for example, alkyl halides, aryl halides, and the like. Among these, alkyl halides are preferred. When the precursor is an alkyl halide, the number of carbons of the alkyl halide is preferably 5 or more and 20 or less, and more preferably 5 or more and 15 or less. The alkyl halide preferably has at least one unsaturated bond. The unsaturated bond is not limited to a double bond between atoms, but may be a multiple bond such as a triple bond.

The alkyl halide preferably has an unsaturated bond in at least one terminal. "At least one terminal" means any one or more terminals when there are a plurality of terminals. In the alkyl halide having an unsaturated bond in at least one terminal, for example, when the alkyl halide has a linear structure, unsaturated bonds are included at both of the terminals of the straight chain, or an unsaturated bond is included at either terminal.

The alkyl halide preferably includes 0.5 or more and 2 or less halogen atoms per carbon atom included in the molecule. In the present disclosure, by setting the number of halogen atoms included in the alkyl halide to 0.5 or more and 2 or less per carbon atom included in the alkyl halide, the number of halogens included in the alkyl halide having 5 or more and 20 or less carbons becomes 3 or more and 40 or less.

The number of halogen atoms included in the alkyl halide per carbon atom is more preferably 0.7 or more and 1.8 or less, and more preferably 1 or more and 1.5 and less. The number of halogens included in the alkyl halide having 5 or more and 20 or less carbons is more preferably 4 or more and 35 or less, and more preferably 5 or more and 30 or less.

In the present disclosure, the precursor further forms a first chemical bond in the first region R1. Specifically, the precursor is chemically adsorbed (hereinafter referred to as chemisorption) on silicon nitride (SiN) constituting the first region R1 (see FIG. 4). The form of the chemical bond is preferably a covalent bond, but a covalent bond and a chemical bond other than the covalent bond (ionic bond and the like) may be mixed. A part of the precursor may be covalently bonded to the first region R1, and another part may be physically adsorbed (hereinafter, referred to as physisorption) by intermolecular force and the like.

In the present disclosure, the precursor does not form a chemical bond with the second region R2. Specifically, the precursor is not chemisorbed to the silicon oxide ($SiO_2$) constituting the second region R2, or all or part of the precursor is physisorbed to the second region R2 by intermolecular force and the like (see FIG. 4).

FIG. 5 illustrates a reaction formula representing a chemical reaction in which the precursor forms a chemical bond with a substrate surface. In the present disclosure, the precursor can form a carbon-nitrogen bond by binding to nitrogen present on the surface of the first region R1 (silicon nitride) (see FIGS. 4 and 5). In contrast, the precursor does not bind or is less likely to bind to oxygen present on the surface of the second region R2 (silicon oxide) (see FIG. 4).

In the alkyl halide according to the present disclosure, the number of carbon atoms is 5 or more and 20 or less, the number of halogen atoms per carbon atom is 0.5 or more and 2 or less, and the carbon-nitrogen bond with silicon nitride is formed. The component of the alkyl halide is not limited.

Examples of the alkyl halide include alkenyl compounds such as 1,6-divinylperfluorohexane and the like; silane coupling compounds such as chlorodimethyl (3,3,4,4,5,5,6,6,7,7,8,8,8-tridecafluoro-n-octyl) silane, chloro (3,3,4,4,5,5,6,6,7,7,8,8,9,9,10,10,10-heptadecafluorodecyl) dimethyl silane, triethoxy-1H,1H,2H,2H-tridecafluoro-n-octylsilane, trichloro(1H,1H,2H,2H-tridecafluoro-n-octyl)silanes, and the like; carboxylic acids such as undecafluorohexanoic acid and the like; sulfonic acids such as heptadecafluorooctane sulfonic acid; phosphonic acids such as (1H,1H,2H,2H-heptadecafluorodecyl) phosphonic acid and the like; and the like. Among these, 1,6-divinylperfluorohexane, which has an unsaturated bond at a terminal, is preferred.

Figure 6:
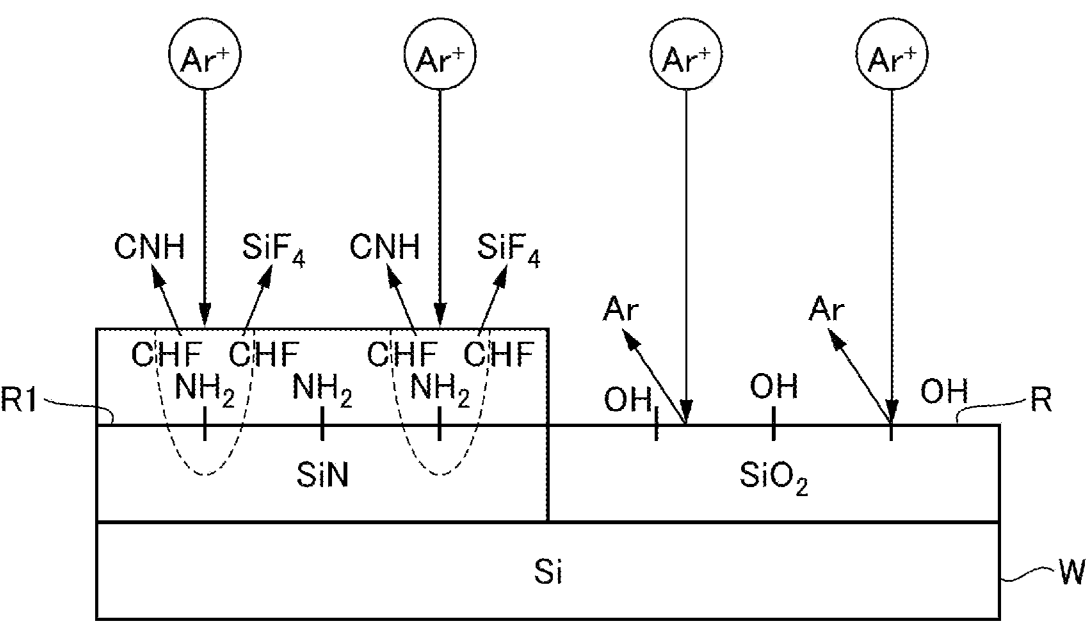
FIG. 6 is an image of the substrate being exposed to a plasma of an inert gas.

In step S13, the substrate surface is exposed to a plasma of an inert gas (see FIG. 6). The inert gas is a gas that does not easily cause a chemical reaction, preferably a noble gas, and more preferably argon (Ar) gas. "Expose the substrate surface to a plasma" means that the plasma is in contact with the substrate surface via a plasma sheath.

In this step, a plasma of an inert gas is generated by exciting the inert gas supplied to the substrate surface by RF (Radio Frequency) power and the like. The plasma of the inert gas produces an ionized cation from the molecule constituting the inert gas. For example, a plasma of an Ar gas produces an Ar ion ($Ar^+$). By exposing the substrate surface to the plasma in this state, the cation ($Ar^+$) in the plasma is accelerated by the intervening plasma sheath and irradiated to the substrate surface.

In the present disclosure, as illustrated in FIG. 6, when the surface of the substrate W is exposed to the plasma of the inert gas (Ar) and the cation ($Ar^+$) is irradiated, in the first region R1 where the precursor is chemisorbed, the portion illustrated by the dashed line in FIG. 6 is excited by the energy from the irradiated cation ($Ar^+$). As a result, a part of the first region R1 and a precursor chemisorbing to the first region R1 are mixed, and an active species of a silicon fluoride such as silicon tetrafluoride and the like or a nitride carbon such as a hydrocarbon nitride (CNH) and the like are generated, and the first region R1 of the surface of the substrate W is etched (see FIGS. 6 and 7). In contrast, the second region R2 in which the precursor is not chemisorbed is not etched (see FIG. 7).

Figure 3:
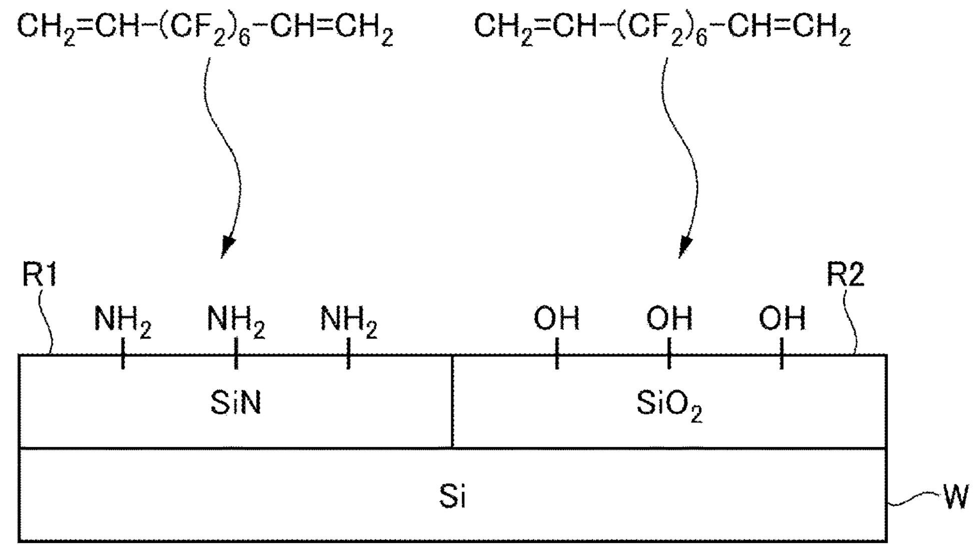
FIG. 3 is an image of a substrate when the precursor is being supplied.

In the present disclosure, a precursor (1,6-divinylperfluorohexane, and the like) including both a halogen and carbon and forming a first chemical bond (carbon-nitrogen bond) in the first region R1 is supplied to the surface of the substrate W having the first region R1 (silicon nitride) (see FIGS. 1, 2, and 3). Accordingly, the precursor as an etchant can be selectively chemisorbed to the first region R1 of the substrate W (see FIGS. 4 and 5). When the surface of the substrate W in which the precursor as an etchant has been chemisorbed to the first region R1 is exposed to a plasma of an inert gas and irradiated with Ar ions ($Ar^+$), the etching process can be performed selectively on the first region R1 of the surface of the substrate W (see FIGS. 6 and 7).

Figure 4:
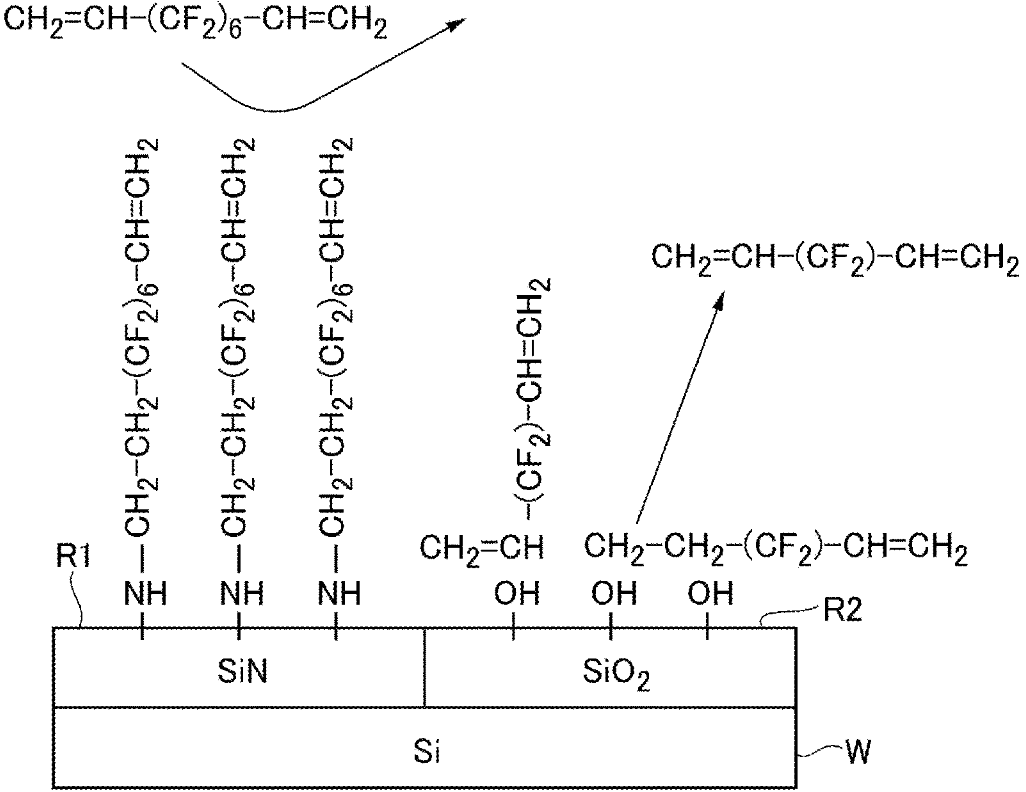
FIG. 4 is an image of a substrate after the precursor is supplied.

In the present disclosure, by supplying a precursor (1,6-divinyl perfluorohexane and the like) forming a chemical bond with the surface of the substrate W, only a precursor that can be chemisorbed to the surface of the substrate W can be deposited on the surface of the substrate W (see FIGS. 3, 4, and 5). Therefore, unlike the case where the etchant is physisorbed to the surface of the substrate W (for example, when ions formed by the plasma of the etchant are irradiated onto the substrate surface), the etching process can be easily controlled and a stable etching process can be performed (see FIGS. 6 and 7).

Further, in the present disclosure, a precursor (1,6-divinyl perfluorohexane and the like) that forms a chemical bond with the surface of the substrate W is chemisorbed to the surface of the substrate W, so that the precursor as an etchant can be deposited only in the region to be processed on the surface of the substrate W (see FIGS. 4 and 5). Accordingly, the precursor is less likely to be deposited in the region (the second region R2) that is not the region to be processed on the surface of the substrate W and in the part (for example, side walls in the processing chamber) other than the substrate. Therefore, the generation of particles can be prevented (see FIGS. 4, 5, 6, and 7).

Further, in the present disclosure, a precursor including an alkyl halide (1,6-divinyl perfluorohexane or the like) having 5 or more and 20 or less carbons is supplied to the surface of the substrate W. Accordingly, a bulky precursor as an etchant can be chemisorbed to the surface of the substrate W (see FIGS. 3, 4, and 5). Therefore, a sufficient amount of the etchant can be deposited on the surface of the substrate W without forcibly depositing the etchant on the substrate surface by physisorbing the etchant that is formed into a plasma, or without increasing the amount of the etchant to be deposited.

In the present disclosure, when the alkyl halide included in the precursor has an unsaturated bond (for example, when the precursor includes 1,6-divinyl perfluorohexane and the like), an addition reaction can occur between the unsaturated bond of the alkyl halide and the first region R1 on the surface of the substrate W (see FIG. 5). Thus, the precursor including such an alkyl halide can chemisorb via the unsaturated bond to the first region R1 of the surface of the substrate W.

In the present disclosure, the alkyl halide included in the precursor has the unsaturated bond in at least one of the terminals (for example, when the precursor includes 1,6-divinyl perfluorohexane and the like). Accordingly, steric hindrance is less likely to occur when the addition reaction occurs between the unsaturated bond at the terminal of the alkyl halide and the first region R1 of the surface of the substrate W. Therefore, the precursor including such an alkyl halide is likely to be chemisorbed to the first region R1 of the surface of the substrate W via the unsaturated bond at the terminal (see FIGS. 4 and 5).

In the alkyl halide, by setting the number of halogen atoms to 0.5 or more and 2 or less per carbon atom (for example, when the precursor includes 1,6-divinyl perfluorohexane and the like), the number of halogens included in the alkyl halide having 5 or more and 20 or less carbons becomes 3 or more and 40 or less. Accordingly, even when the alkyl halide included in the precursor is bulky, the amount of halogens (fluorine) as an etchant included in the precursor supplied to the surface of the substrate W can be secured.

Figure 8:
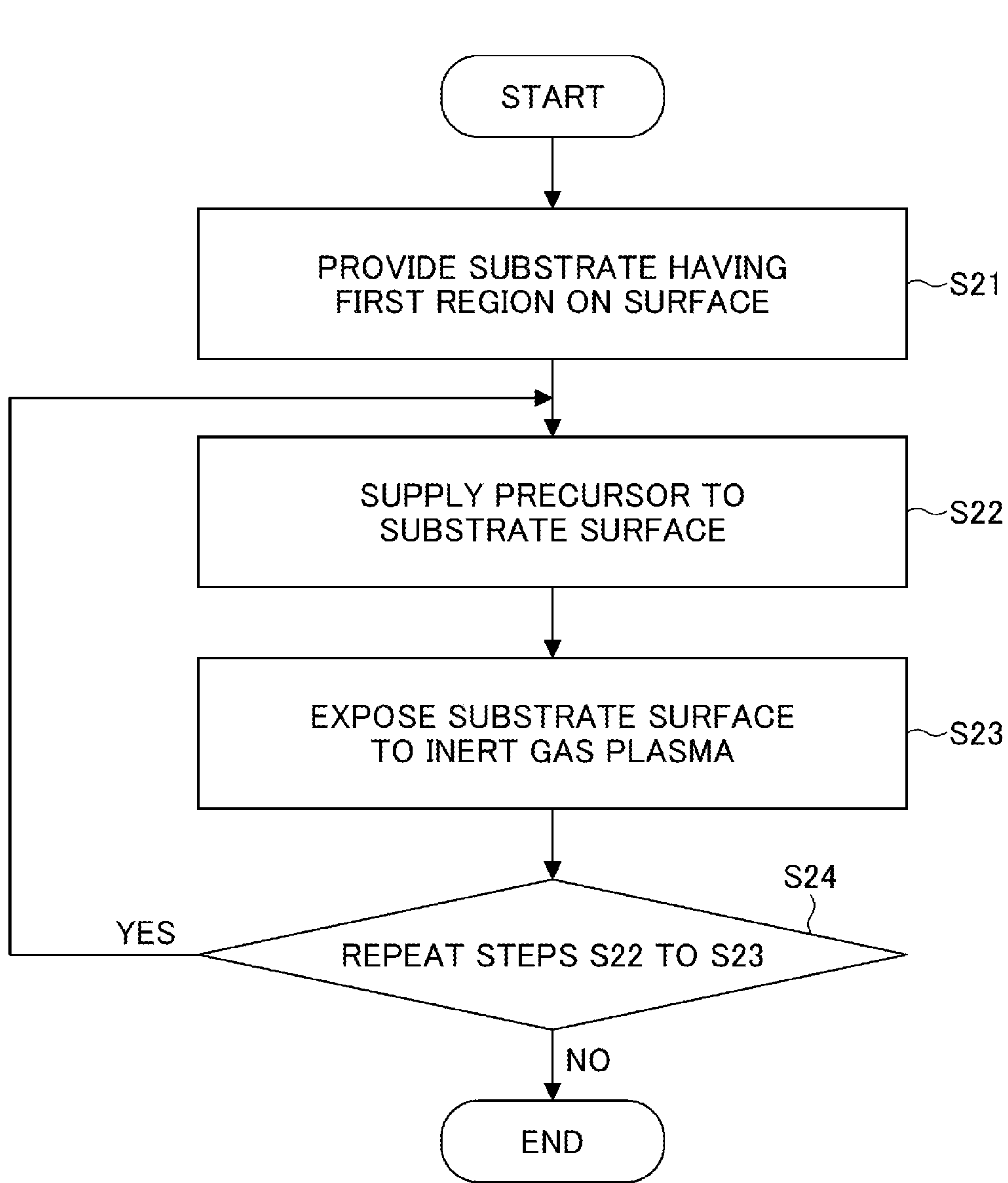
FIG. 8 is a flowchart illustrating an example of a substrate processing method according to the second embodiment.

The substrate processing method according to the second embodiment will be described with reference to FIG. 8. FIG. 8 is a flowchart illustrating an example of a substrate processing method according to the second embodiment. In FIG. 8, the part common to FIG. 1 is denoted by the corresponding reference numeral in FIG. 1, and the description thereof is omitted.

The substrate processing method according to the second embodiment repeats b) and c) described above. In the present disclosure, after step S23, the process returns to step S22, and steps S22 and S23 are repeated (step S24 in FIG. 8).

Specifically, the precursor is further supplied to the surface of the substrate W in which the precursor has been chemisorbed to the first region R1, so that the supplied precursor is chemisorbed to the precursor that has been chemisorbed to the first region R1. In this case, it is preferable to modify the precursor that has been chemisorbed to the first region R1 to form a chemical bond (polymerize) with the supplied precursor. The manner of modifying the precursor is freely determined.

In the present disclosure, by repeating each step of b) and c), the bulkiness of the precursor that chemisorbs to the substrate surface can be further increased. Therefore, when the substrate surface is exposed to the plasma of the inert gas, a stable etching process can be performed with high accuracy.

Figure 9:
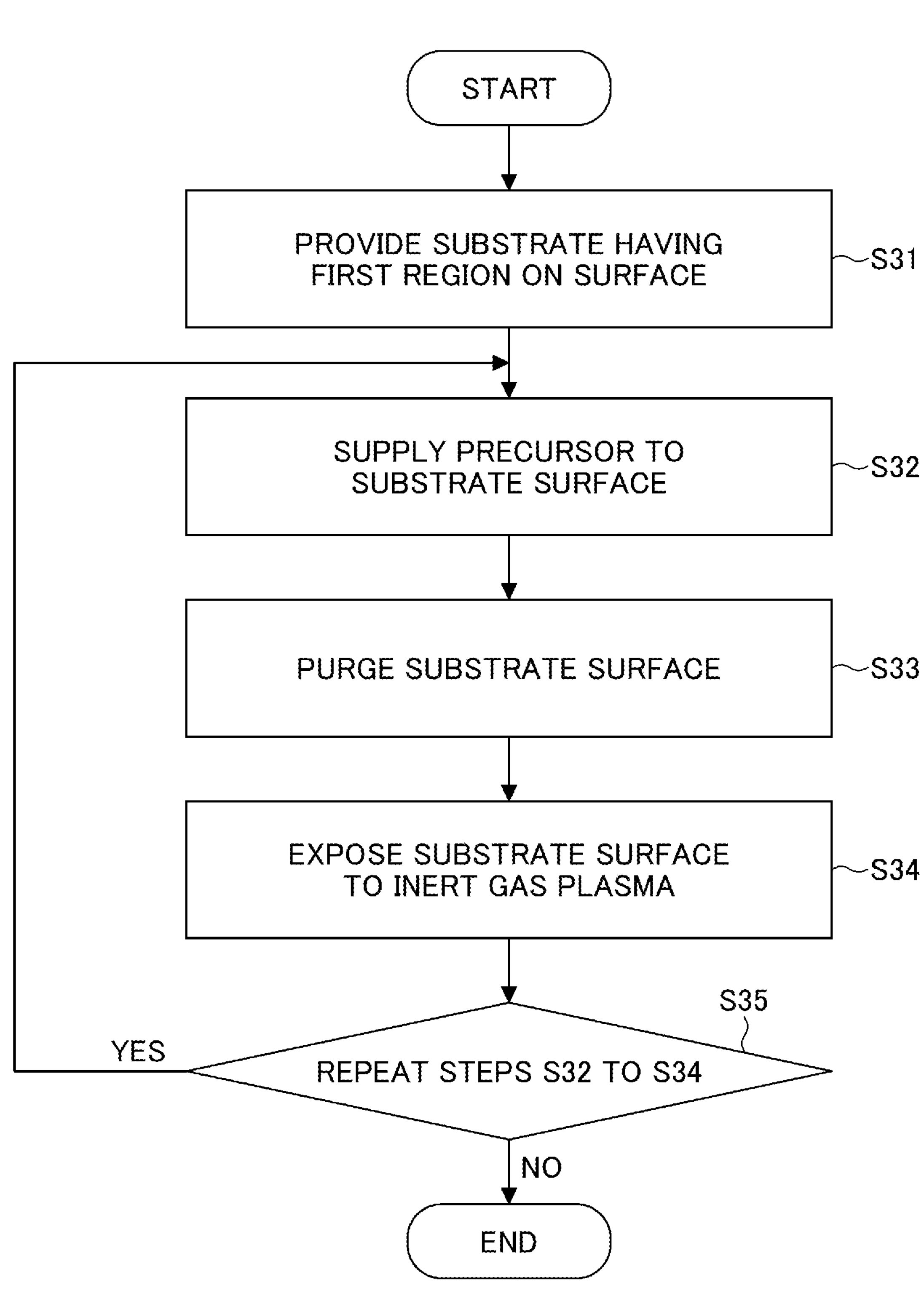
FIG. 9 is a flowchart illustrating an example of a substrate processing method according to the third embodiment.

The substrate processing method according to the third embodiment will be described with reference to FIG. 9. FIG. 9 is a flowchart illustrating an example of a substrate processing method according to the third embodiment. In FIG. 9, the part common to FIG. 8 is denoted by the corresponding reference numeral in FIG. 8, and the description thereof is omitted.

The substrate processing method according to the third embodiment includes e) purging the substrate surface between b) and c) described above. In the present disclosure, the surface of the substrate W is purged after step S32 and before step S34 (step S33 in FIG. 9).

Figure 10:
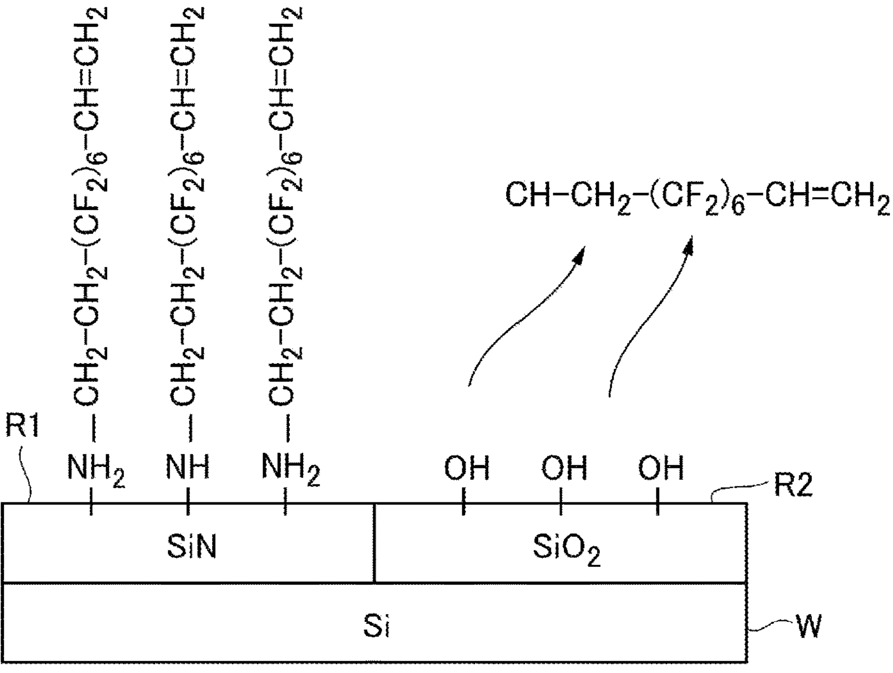
FIG. 10 is an image of a substrate when the precursor is being purged.

The purging of the substrate surface means, for example, supplying a purge gas to the substrate surface to clean the substrate surface. In the present disclosure, the precursor that is not chemisorbed to the second region R2 of the surface of the substrate W is removed (see FIGS. 4 and 10). The component of the purge gas is not limited. The purge gas is preferably a gas that does not cause a chemical reaction or a gas that does not easily cause a chemical reaction, more preferably a noble gas, and further more preferably an argon (Ar) gas. The purging of the surface of the substrate W may be stopping the gas supply and removing by vacuuming the precursor that is not chemisorbed, to clean the surface of the substrate W.

In the present disclosure, the surface of the substrate W supplied with the precursor (for example, 1,6-divinyl perfluorohexane and the like) is purged prior to be exposed to the plasma of the inert gas. Accordingly, impurities such as particles and an excess precursor on the surface of the substrate W can be removed (see FIGS. 4 and 10). Therefore, when the surface of the substrate W is exposed to the plasma of the inert gas in step S34, the supplied inert gas does not include any residue of the precursor and does not produce ions or radicals derived from the residue of the precursor. Thus, the etching process can be performed selectively on the first region R1 (silicon nitride) of the surface of the substrate W.

Figure 11:
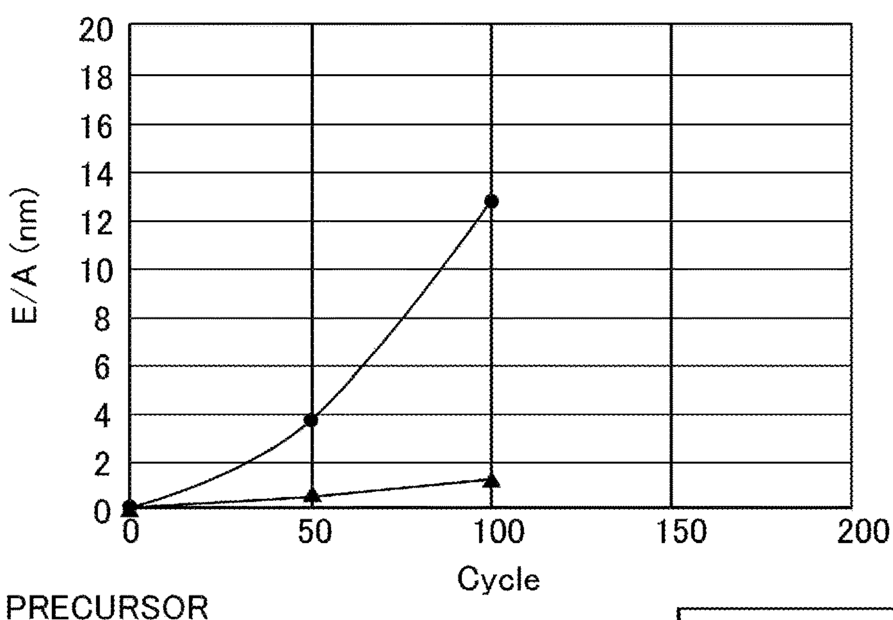
FIG. 11 is a graph illustrating etching depth on a substrate surface.

The effect of etching process on the surface of the substrate W according to the substrate processing method of the third embodiment will be described with reference to FIG. 11. FIG. 11 illustrates a relationship between a number of cycles (Cycle) and etching depth E/A (nm) when a freon gas (1,6-divinyl perfluorohexane) as the precursor was supplied to the surface of the substrate W for about seconds (sec) and purged with an inert gas (Ar gas) for about 20 seconds (sec), according to the substrate processing method of the third embodiment.

According to FIG. 11, in the second region R2 ($SiO_2$), the etching depth E/A (nm) is less than 2 nm even when the number of cycles reaches 100. In contrast, in the first region R1 (SiN), the etching depth E/A (nm) rises to about 4 nm when the number of cycles is 50, and the etching depth E/A (nm) exceeds 12 nm when the number of cycles is 100. Thus, FIG. 11 indicates that the etching process is performed selectively on the first region R1 of the surface of the substrate W by the substrate processing method according to the present disclosure.

Figure 12:
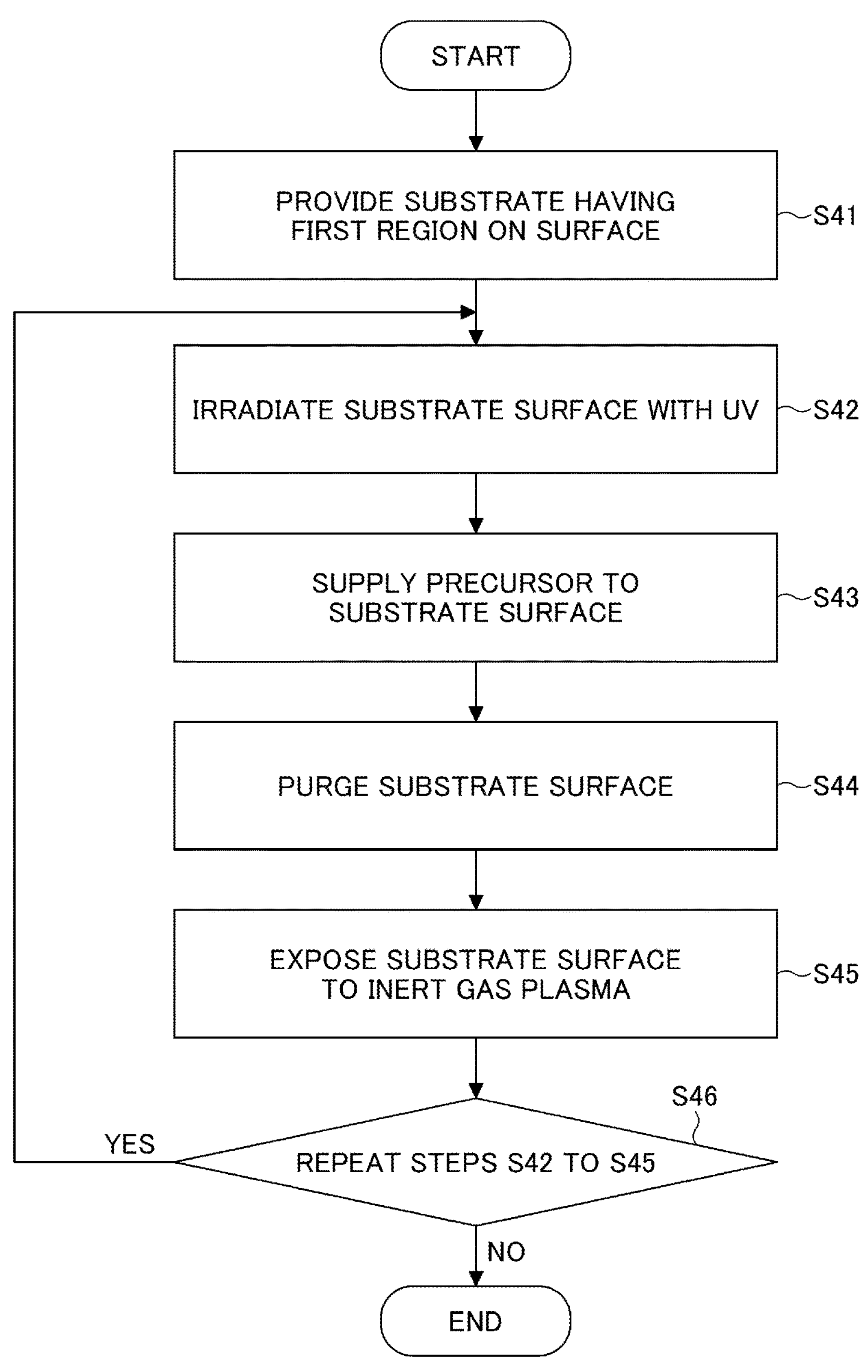
FIG. 12 is a flowchart illustrating an example of a substrate processing method according to the fourth embodiment.

The substrate processing method according to the fourth embodiment will be described with reference to FIG. 12. FIG. 12 is a flowchart illustrating an example of a substrate processing method according to the fourth embodiment. In FIG. 12, the part common to FIG. 9 is denoted by the corresponding reference numeral in FIG. 9, and the description thereof is omitted.

The substrate processing method according to the fourth embodiment includes d) irradiating the substrate surface with ultraviolet light prior to b) described above. In the present disclosure, ultraviolet light (UV) is irradiated before step S43 (step S42 in FIG. 12). UV is an electromagnetic wave having a wavelength of about 1 to 380 nm, which is shorter than visible light and longer than X-rays. The manner of irradiating UV is not limited, and light sources such as UV lamps, UV irradiators, and the like can be used, for example. A plasma of He gas and the like that emits light having a wavelength of ultraviolet light (UV) may be formed on the substrate W.

In the present disclosure, the surface of the substrate W to which UV is irradiated is the substrate surface before the precursor is supplied (step S41 and step S42 in FIG. 12), and the substrate surface on which the precursor is already chemisorbed (step S46 and step S42 in FIG. 12).

In the present disclosure, the surface of the substrate W is irradiated with ultraviolet light (UV) prior to supplying the precursor (such as 1,6-divinyl perfluorohexane). Accordingly, the surface of the substrate W can be cleaned by removing impurities (not illustrated) from the surface of the substrate W, for example. Therefore, the precursor is easily chemisorbed to the cleaned surface of the substrate W.

Further, in a case where the precursor (1,6-divinyl perfluorohexane or the like) has already been chemisorbed to the surface of the substrate W, when ultraviolet light (UV) is irradiated on the surface of the substrate W, the precursor that has been chemisorbed to the surface of the substrate W is modified and becomes likely to chemically bond (polymerize) to another precursor. Then, when an additional precursor is supplied, the precursors are chemically bonded (polymerized) to each other, and a bulkier precursor is deposited on the substrate surface. Accordingly, the amount of the precursor deposited on the surface of the substrate W can be adjusted when the precursor is chemisorbed to the surface of the substrate W.

Figure 13:
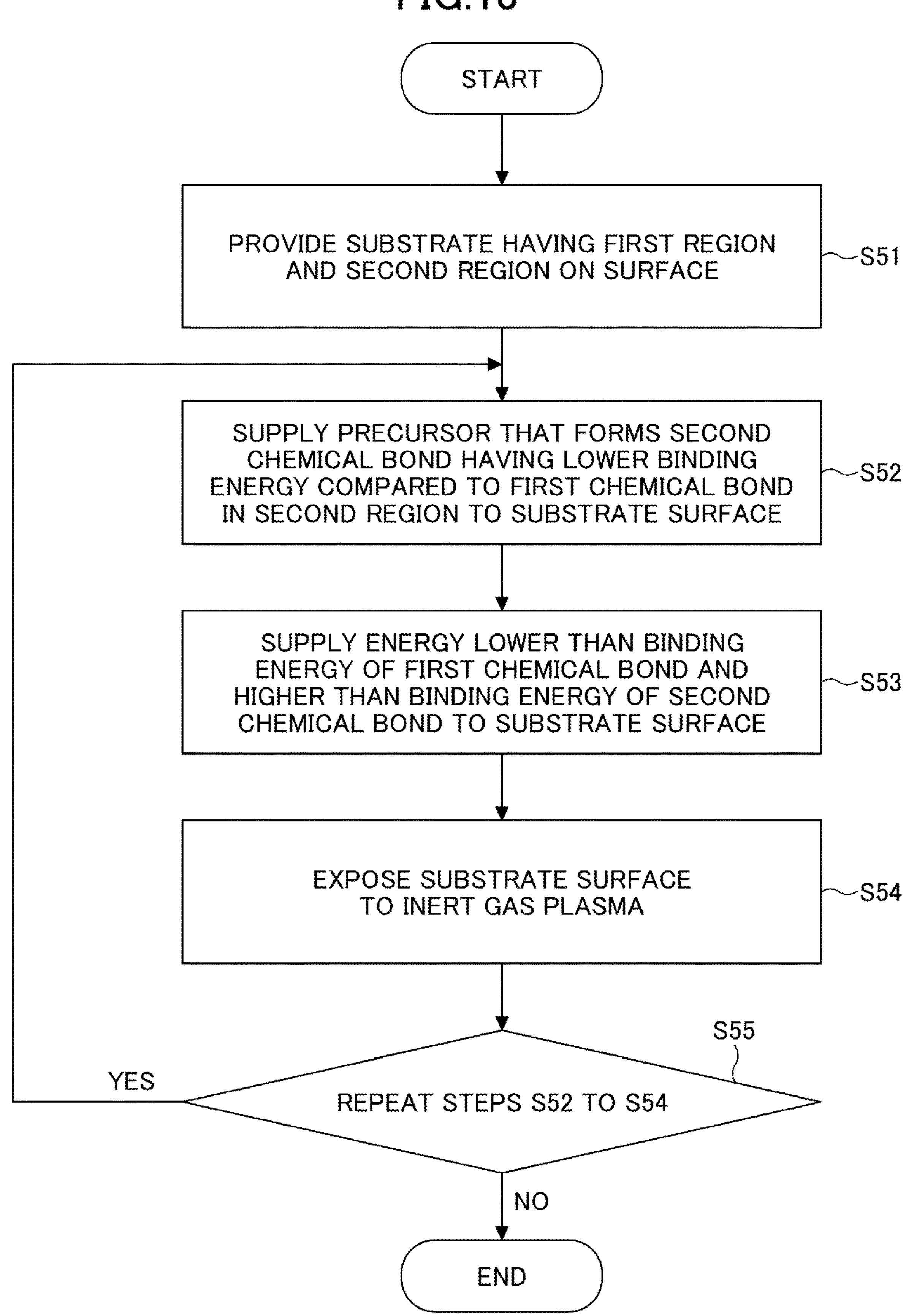
FIG. 13 is a flowchart illustrating an example of a substrate processing method according to the fifth embodiment.

A substrate processing method according to the fifth embodiment will be described with reference to FIG. 13. FIG. 13 is a flowchart illustrating an example of a substrate processing method according to the fifth embodiment. In FIG. 13, the part common to FIG. 8 is denoted by the corresponding reference numeral in FIG. 8, and the description thereof is omitted.

In the substrate processing method according to the fifth embodiment, the substrate further includes a second region on the surface, and the precursor forms a second chemical bond that has lower binding energy compared to the first chemical bond in the second region. The substrate processing method includes f) supplying energy lower than the binding energy of the first chemical bond and higher than the binding energy of the second chemical bond to the substrate surface after b) described above.

The binding energy means the energy (dissociation energy) required to break the bond (to dissociate the bonding atom) when two or more atoms are bonded. The supplied energy is not limited, and various types of energy can be used, including thermal energy, electrical energy, vibratory energy, light energy, and the like.

In the present disclosure, in step S51, a substrate having the first region and the second region on the surface is provided. Specifically, similarly to the first embodiment, a substrate W having a first region R1 formed of silicon nitride (SiN) and a second region R2 formed of silicon oxide ($SiO_2$) on the surface is prepared (see FIG. 2).

Then, in step S52, the precursor that forms the second chemical bond having lower binding energy compared to the first chemical bond in the second region is supplied to the substrate surface. Accordingly, the precursor chemisorbs to both of the first region R1 and the second region R2 on the surface of the substrate W.

In the present disclosure, the precursor is not limited, and for example, the precursor is a nitrogen-containing carbonyl compound containing a halogen and carbon, and preferably an isocyanate containing a halogen and carbon (halogenated isocyanate). The isocyanate is a compound having a partial structure of —N═C═O. The isocyanate may have a plurality of partial structures having —N═C═O (for example, diisocyanate). The isocyanate may also be substituted with other substituents. Examples of the isocyanate include aromatic isocyanates and aliphatic isocyanates.

In the present disclosure, when such an isocyanate is used as the precursor, a urea bond is formed as the first chemical bond in the first region R1 formed of silicon nitride, and a urethane bond is formed as the second chemical bond in the second region R2 formed of silicon oxide.

Then, in step S53, energy lower than the binding energy of the first chemical bond and higher than the binding energy of the second chemical bond is supplied to the substrate surface. In step S53, in the second region R2 of the surface of the substrate W, the second chemical bond is dissociated and the precursor is removed from the second region R2. In the first region R1 of the surface of the substrate W, the first chemical bond is not dissociated, and the precursor remains chemisorbed to the first region R1.

In the present disclosure, when such energy is supplied to the substrate surface, in f) described above, it is preferable that the temperature of the substrate surface is below the temperature at which the first chemical bond is broken and above the temperature at which the second chemical bond is broken. The temperature at which the first chemical bond is broken means the temperature equivalent to the binding energy (or dissociation energy) of the first chemical bond. The temperature at which the second chemical bond is broken means the temperature equivalent to the binding energy (or dissociation energy) of the second chemical bond.

In the present disclosure, when an isocyanate is used as the precursor, as described above, a urea bond is formed in the first region R1, and a urethane bond is formed in the second region R2. Because both the urea bond and the urethane bond include a carbonyl group, these bonds are energetically stabilized by electron delocalization. The electronegativity of the atom adjacent to the carbonyl group is higher when the atom is oxygen compared to when the atom is nitrogen. Thus, the effect of the electron delocalization in the urethane bond including an ester is smaller than that of the urea bond including an amide. Therefore, the binding energy of the urethane bond is lower than that of the urea bond.

In the present disclosure, such a difference in properties between the first chemical bond (urea bond) and the second chemical bond (urethane bond) is utilized. That is, the precursor (isocyanate) is supplied to the surface of the substrate W having the first region R1 (silicon nitride) and the second region R2 (silicon oxide), and the precursor forms the first chemical bond (urea bond) in the first region R1 (silicon nitride) and the second chemical bond (urethane bond) in the second region R2 (silicon oxide), the second chemical bond (urethane bond) having lower binding energy compared to the first chemical bond (urea bond). Thus, the precursor (isocyanate) chemisorbs to both the first region R1 (silicon nitride) and the second region R2 (silicon oxide) of the surface of the substrate W.

Then, to the surface of the substrate W on which the precursor (isocyanate) is chemically adsorbed, energy lower than the binding energy of the first chemical bond (urea bond) and higher than the binding energy of the second chemical bond (urethane bond) is supplied. In the second region R2 (silicon oxide) on the surface of the substrate W, the second chemical bond (urethane bond) is dissociated (or broken), and the precursor (isocyanate) is removed from the second region R2 (silicon oxide). In the first region R1 (silicon nitride) on the surface of the substrate W, the first chemical bond (urea bond) is not dissociated (or unbroken), and the precursor (isocyanate) remains chemisorbed to the first region R1 (silicon nitride).

In the present disclosure, as described above, when the substrate W having the first region R1 (silicon nitride) and the second region R2 (silicon oxide) is used, the precursor (isocyanate) is supplied, and the precursor (isocyanate) forms the first chemical bond (urea bond) in the first region R1 (silicon nitride) and the second chemical bond (urethane bond) that has lower binding energy compared to the first chemical bond (urea bond) in the second region. Then, energy lower than the binding energy of the first chemical bond (urea bond) and higher than the binding energy of the second chemical bond (urethane bond) is supplied to the surface of the substrate W.

The precursor that can be used is not limited to materials that chemisorb only to the first region R1 (silicon nitride) that is the region to be processed on the surface of the substrate W. That is, a precursor that chemisorbs to a region (silicon oxide) that is not the region to be processed on the surface of the substrate W can be used. Therefore, in the present embodiment, the range of choices for the precursor that can be used as processing materials such as etchants is expanded.

In the present disclosure, by adjusting the temperature of the surface of the substrate W to which the precursor (isocyanate) chemisorbs, to the temperature lower than or equal to the temperature at which the first chemical bond is broken and higher than or equal to the temperature at which the second chemical bond is broken, the second chemical bond (urethane bond) of the second region R2 is broken while the first chemical bond (urea bond) of the first region R1 is not broken. Accordingly, on the surface of the substrate W, the precursor (isocyanate) chemisorbed on a region (the second region R2) that is not the region to be processed is removed with high accuracy, and the precursor (isocyanate) chemisorbed on a region (the first region R1) that is the region to be processed can be left with high accuracy.

<Substrate Processing Apparatus>

Figure 14:
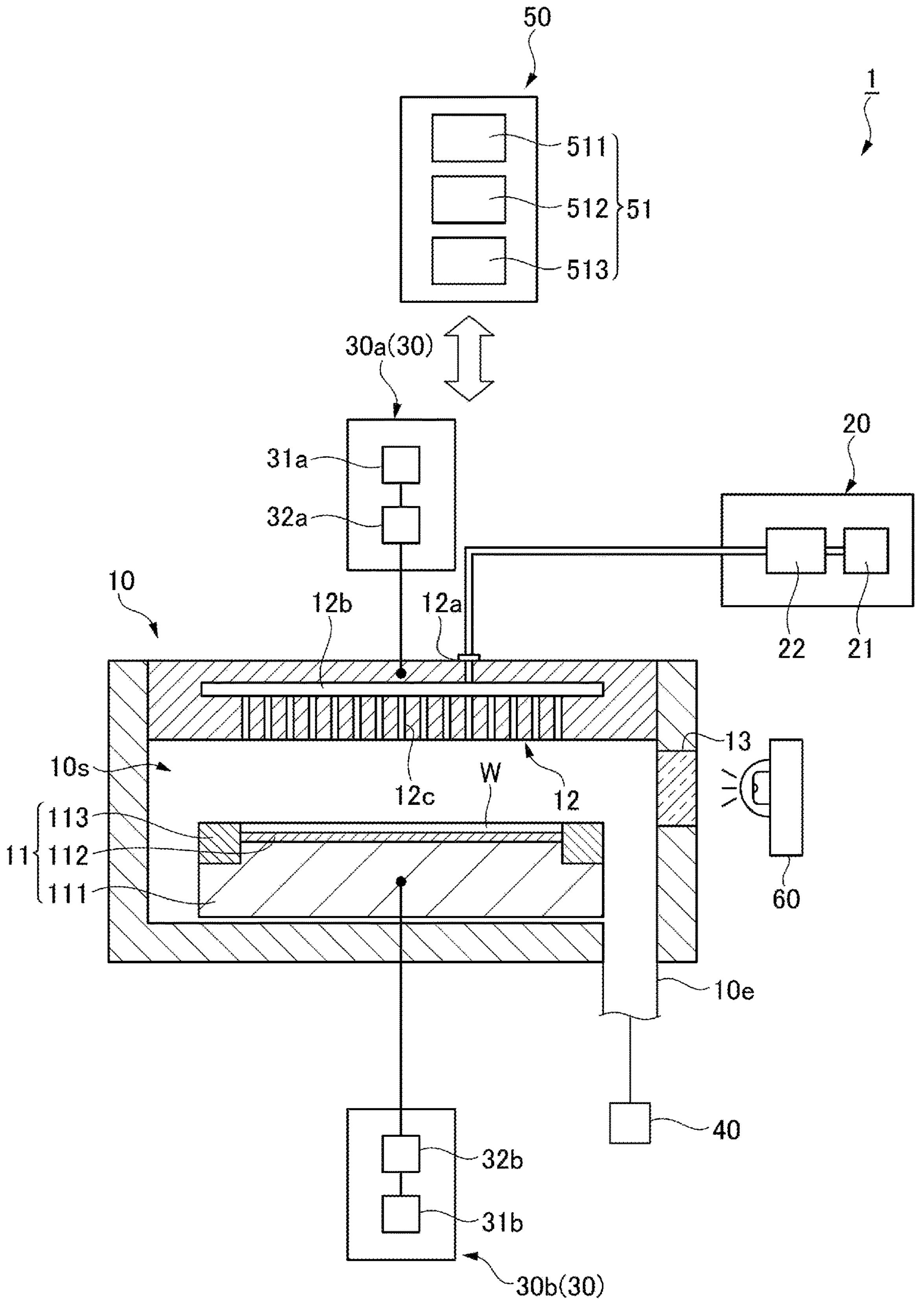
FIG. 14 is a cross-sectional view illustrating an example of a substrate processing apparatus according to an embodiment.

A substrate processing apparatus according to an embodiment will be described with reference to FIG. 14. FIG. 14 is a cross-sectional diagram illustrating an example of a substrate processing apparatus according to the present disclosure. As an example of the substrate processing apparatus 1, a plasma processing apparatus (for example, a plasma etching apparatus) will be described. In the present disclosure, the substrate processing apparatus 1 includes a chamber 10, a gas supply 20, an RF power supply 30, an exhaust system 40, and a controller 50.

The chamber 10 includes a support 11 and an upper electrode showerhead 12 within the processing space 10*s* to etch the substrate W. The support 11 is provided in a lower region of the processing space 10*s* in the chamber 10. The upper electrode showerhead 12 is positioned above the support 11 and may function as part of the ceiling of the chamber 10. The chamber is an example of the chamber for etching a substrate that constitutes the substrate processing apparatus according to the present disclosure.

The support 11 is configured to support the substrate in the processing space 10*s*. In the present disclosure, as a substrate, a substrate W having a first region R1 formed of silicon nitride (SiN) and a second region R2 formed of silicon oxide ($SiO_2$) on its surface is used (see FIG. 2).

In the present disclosure, the support 11 includes a lower electrode 111, an electrostatic chuck 112, and an edge ring 113. The electrostatic chuck 112 is provided on the lower electrode 111 and is configured to support the substrate W on the upper surface of the electrostatic chuck 112. The edge ring 113 is positioned to surround the substrate W at the top of the periphery of the lower electrode 111 (see FIG. 14).

The support 11 may include a temperature control module (not illustrated) configured to adjust the temperature of at least one of the electrostatic chuck 112 and the substrate W to a target temperature. The temperature control module may include a heater, a flow path, or a combination thereof. Through the flow path, a temperature control fluid such as refrigerant and heat transfer gas flows. The support 11 is an example of a mount that constitutes a part of the substrate processing apparatus according to the present disclosure.

The upper electrode showerhead 12 is configured to supply one or more process gases from the gas supply 20 to the processing space 10*s*. The upper electrode showerhead 12 includes a gas inlet 12*a*, a gas diffusion chamber 12*b*, and a plurality of gas outlets 12*c*.

The gas inlet 12*a* is in fluid communication with the gas supply 20 and the gas diffusion chamber 12*b*. The gas outlets 12*c* are in fluid communication with the gas diffusion chamber 12*b* and the processing space 10*s*. In the present disclosure, the upper electrode showerhead 12 is configured to supply process gas from the gas inlet 12*a* to the processing space 10*s* through the gas diffusion chamber 12*b* and the gas outlets 12*c*.

The gas supply 20 may include one or more gas sources 21 and one or more flow controllers 22. In the present disclosure, the gas supply 20 is configured to supply process gas to the gas inlet 12*a* via the flow controllers 22, which corresponds to each of the gas sources 21. Each flow controller 22 may include, for example, a mass flow controller or a pressure controlled flow controller. In addition, the gas supply 20 may include one or more flow modulating devices that modulate or pulse the flow rate of the process gas.

In the present disclosure, as the process gas supplied by the gas supply 20 to the processing space 10*s* of the chamber 10, the precursor (1,6-divinyl perfluorohexane) and the inert gas (argon and the like) described above are used (see FIGS. 3 and 6).

When the precursor is supplied to the processing space 10*s*, the inert gas (argon and the like) is mixed with the precursor as a carrier gas for the precursor and supplied to the processing space 10*s* (see step S12 in FIG. 1, step S22 in FIG. 8, step S32 in FIG. 9, step S43 in FIG. 12, and step S52 in FIG. 13).

The inert gas (argon and the like) is also supplied to the processing space 10*s* as a purge gas to purge the surface of the substrate W (see step S33 in FIG. 9 and step S44 in FIG. 12). The inert gas (argon and the like) is supplied after the precursor is supplied to the processing space 10*s* and before the substrate W is exposed to the plasma, and when the precursor supply is stopped. Specifically, step of e) (the step of purging the substrate surface) described above in the substrate processing method according to the present embodiment is performed (see FIGS. 9, 10, and 12).

Further, the inert gas (argon and the like) is supplied to the processing space 10*s* as a single source gas that is formed to be a plasma (an ion that is formed to be a plasma) when the substrate W is exposed to the plasma of the inert gas (see step S13 in FIG. 1, step S23 in FIG. 8, step S34 in FIG. 9, step S45 in FIG. 12, and step S54 in FIG. 13).

The RF power supply 30 is configured to supply a radio frequency (RF) power, for example, one or more RF power (or RF signals) to one or more electrodes, such as the lower electrode 111, the upper electrode showerhead 12, or both the lower electrode 111 and the upper electrode showerhead 12. The RF power represents the power of the high frequency (radio frequency).

As a result, a plasma is formed from the process gas (inert gas) supplied to the processing space 10*s*. Accordingly, the RF power supply 30 may function as at least a part of a plasma generator configured to form a plasma from the process gas (inert gas) in the chamber 10. In the present disclosure, the RF power supply 30 includes a first RF power supply 30*a* and a second RF power supply 30*b*.

The first RF power supply 30*a* includes a first RF generator 31*a* and a first matching circuit 32*a*. In the present disclosure, the first RF power supply 30*a* is configured to supply a first RF signal from the first RF generator 31*a* to the upper electrode showerhead 12 via the first matching circuit 32*a*. For example, the first RF signal may have a frequency in the range of 27 MHz to 100 MHz.

The second RF power supply 30*b* includes a second RF generator 31*b* and a second matching circuit 32*b*. In the present disclosure, the second RF power supply 30*b* is configured to supply a second RF signal from the second RF generator 31*b* to the lower electrode 111 via the second matching circuit 32*b*. For example, the second RF signal may have a frequency in the range of 400 kHz to 13.56 MHz. In the second RF power supply 30*b*, a direct current (DC) pulse generator may be used instead of the second RF generator 31*b*.

Although not illustrated, other embodiments may be considered in the present disclosure. For example, the RF power supply 30 may be configured to supply the first RF signal from the RF generator to the lower electrode 111 and the second RF signal from the other RF generator to the lower electrode 111. The RF power supply 30 may be configured to supply the first RF signal from the RF generator to the lower electrode 111, the second RF signal from the other RF generator to the lower electrode 111, and the third RF signal from the other RF generator to the upper electrode showerhead 12. In the RF power supply 30, a DC voltage may be applied to the upper electrode showerhead 12.

In various embodiments, the amplitude of one or more RF signals (that is, the first RF signals, the second RF signals, and the like) may be pulsed or modulated. The amplitude modulation may include pulsing the RF signal amplitude between an on state and an off state, or between two or more different on states.

The exhaust system 40 may be connected to an exhaust port 10*e* provided, for example, at the bottom of the chamber 10. The exhaust system 40 may include a pressure valve and a vacuum pump. The vacuum pump may include a turbomolecular pump, a roughening pump, or a combination thereof.

In the present disclosure, the substrate processing apparatus 1 may include a UV irradiator 60. The UV irradiator 60 has a function of irradiating the surface of the substrate W with ultraviolet light (UV). The UV irradiator 60 is not limited, and for example, light sources such as a UV lamp, a UV irradiation device, and the like may be used.

The UV irradiator 60 is provided, for example, around the chamber 10 at a position where ultraviolet light (UV) can be irradiated to the surface of the substrate W via a transmissive window 13 provided on the side wall (or top) of the chamber 10 that can transmit ultraviolet light (see FIG. 14). The UV irradiator 60 may be provided within the chamber 10.

The location of the UV irradiator 60 is not limited to the location around the chamber 10 or within the chamber 10. The UV irradiator 60 may be provided in another chamber provided outside the chamber 10, and the substrate W may be transported into the another chamber for UV irradiation. Instead of using the UV irradiator 60, the surface of the substrate W may be irradiated with ultraviolet light (UV) by forming a plasma of a He gas and the like that emits light having a wavelength of ultraviolet light (UV) in the chamber 10.

In the present disclosure, the controller 50 processes computer-executable instructions that cause the substrate processing apparatus 1 to perform various steps described later in the present disclosure. The controller 50 may be configured to control each element of the substrate processing apparatus 1. In the present disclosure, the entirety of the controller 50 is configured as a part of the substrate processing apparatus 1, but the configuration is not limited thereto, and a part or the entirety of the controller 50 may be provided separately from the substrate processing apparatus 1.

The controller 50 may include, for example, a computer 51. The computer 51 may include, for example, a processor (CPU: central processing unit) 511, a storage 512, and a communication interface 513. The controller 50 is an example of the controller that forms a part of the substrate processing apparatus according to the present disclosure.

The processor 511 may be configured to perform various control operations based on a program stored in the storage 512. The storage 512 may include a random access memory (RAM), a read only memory (ROM), a hard disk drive (HDD), a solid state drive (SSD), or combinations thereof. The communication interface 513 may communicate with each element of the substrate processing apparatus 1 via a communication line such as a local area network (LAN).

In the present disclosure, the controller provides a substrate having a first region on a surface to the chamber, supplies a precursor including at least both a halogen and carbon and forming a first chemical bond in the first region to the substrate surface, and controls the substrate surface to be exposed to a plasma of an inert gas.

Specifically, the chamber 10 is controlled by the controller 50, and the steps S11, S21, S31, S41, and S51 described above are performed (see FIGS. 1, 2, 8, 9, 12, and 13). Specifically, step a) of the substrate processing method according to the present embodiment described above (the step of providing a substrate having a first region on a surface) is performed (see FIGS. 1, 2, 8, 9, 12, and 13).

The controller 50 controls the gas supply 20 and the exhaust system 40, and performs step S12, step S22, step S24, step S32, step S33, step S35, step S43, step S44, step S46, step S52, and step S55 (see FIGS. 1, 3, 4, 5, 8, 9, 10, 12, and 13). Specifically, step b) of the substrate processing method according to the present embodiment described above (the step of supplying a precursor to the substrate surface) is performed (see FIGS. 1, 3, 4, 5, 8, 9, 10, 12, and 13).

The controller 50 controls the gas supply 20 and the RF power supply 30, and performs step S13, step S23, step S24, step S34, step S35, step S45, step S46, step S54, and step S55 (see FIGS. 1, 6, 7, 8, 9, 12, and 13). Specifically, step c) of the substrate processing method according to the present embodiment described above (the step of exposing the substrate surface to a plasma of an inert gas) is performed (see FIGS. 1, 6, 7, 8, 9, 12, and 13).

The controller 50 controls the UV irradiator 60, and step S42 and step S46 are executed (see FIG. 12). Specifically, step d) of the substrate processing method according to the present embodiment described above (the step of irradiating the substrate surface with ultraviolet light) is performed (see FIG. 12).

The substrate processing apparatus according to the present disclosure is provided in the chamber, and includes a mount for mounting the substrate. The controller controls to supply RF power to the mount. Specifically, the controller 50 controls the RF power supply 30 and supplies RF power to one or both the lower electrode 111 and the upper electrode showerhead 12 to form a plasma (see FIG. 14).

As a result, a plasma (ion) is formed from an inert gas (argon gas) supplied as a process gas to the processing space 10*s*, and step S13, step S23, step S24, step S34, step S35, step S45, step S46, step S54, and step S55 described above are performed (see FIGS. 1, 6, 7, 8, 9, 12, 13, and 14).

In the substrate processing apparatus 1 according to the present disclosure, a precursor (1,6-divinyl perfluorohexane and the like) including both a halogen and carbon and forming a first chemical bond (carbon-nitrogen bond) in the first region R1 is supplied to the surface of the substrate W having the first region R1 (silicon nitride) (step S11 to step S13 in FIG. 1 and the like). Accordingly, the precursor as an etchant can be selectively chemisorbed to the first region R1 of the substrate W. When the surface of the substrate W in which the precursor as an etchant has been chemisorbed to the first region R1 is exposed to a plasma of an inert gas (Ar ions), the etching process can be performed selectively on the first region R1 of the surface of the substrate W (see FIGS. 6, 7, and 14).

In the substrate processing apparatus 1 according to the present disclosure, by supplying a precursor (1,6-divinyl perfluorohexane and the like) forming a chemical bond with the surface of the substrate W, only a precursor that can be chemisorbed to the surface of the substrate W can be deposited on the surface of the substrate W (see FIGS. 3, 4, 5, and 14). Therefore, unlike the case where the etchant is physisorbed to the surface of the substrate W (for example, when ions formed by the plasma of the etchant are irradiated onto the surface of the substrate W), the etching process can be easily controlled and a stable etching process can be performed (see FIGS. 6, 7, 11, and 14).

Further, in the substrate processing apparatus 1 according to the present embodiment, a precursor (1,6-divinyl perfluorohexane and the like) that forms a chemical bond with the surface of the substrate W is chemisorbed to the surface of the substrate W, so that the precursor as an etchant can be deposited only in the region to be processed on the surface of the substrate W (see FIGS. 4, 5, and 14). Accordingly, the precursor is less likely to be deposited in the region (the second region R2) that is not the region to be processed on the surface of the substrate W and in the part (for example, side walls in the processing chamber) other than the substrate. Therefore, the generation of particles can be prevented (see FIGS. 4, 5, 6, 7, and 14).

In the substrate processing apparatus 1 according to the present disclosure, the controller 50 controls the substrate processing apparatus 1 to supply RF power to the mount (the support 11) provided in the chamber 10 for mounting the substrate W, thereby forming a biasing electrode on the mount (the support 11) to which RF power is supplied. Accordingly, the ion (argon ion) of the inert gas (argon gas) generated by the plasma of the inert gas is drawn to the surface of the substrate W mounted on the mount (the support 11), and the precursor chemisorbed to the first region of the surface of the substrate W is excited. Thus, etching is facilitated in the first region of the surface of the substrate W, and the efficient etching process can be performed (see FIGS. 6, 7, 11, and 14).

Figure 7:
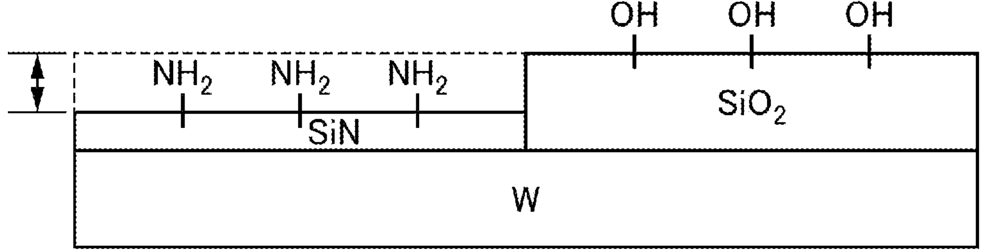
FIG. 7 is an image of the substrate after being exposed to the plasma of an inert gas.

Further, in the substrate processing apparatus 1 according to the present embodiment, because RF power is supplied to the mount (the support 11) in the chamber 10, a portion (for example, a side wall and the like) other than the substrate W mounted on the mount (the support 11) is less likely to be etched in the chamber 10 (see FIGS. 6, 7, and 14). Accordingly, erosion in the chamber 10 and the accompanying particle generation can be prevented. Therefore, a stable etching process can be performed, and maintenance of the substrate processing apparatus becomes easy.

In the embodiment described above, it is preferable that step of b) (the step of supplying the precursor to the substrate surface) and step of c) (the step of exposing the substrate surface to a plasma of an inert gas) described above are performed without being exposed to the atmosphere. In the present embodiment, each step of b) and c) is performed while maintaining a vacuum (without breaking a vacuum).

In the present embodiment, because each step of b) and c) described above is performed without being exposed to the atmosphere, the influence of the moisture in the atmosphere on the process characteristics can be reduced.

In the embodiment described above, each step of b) and c) is continuously performed by one substrate processing apparatus 1, but is not limited thereto. For example, each step of b) and c) may be performed in the same chamber or in the same processing system (in-situ), as described above. Each step of b) and c) may be performed in separate chambers.

When each step of b) and c) is performed in separate chambers, each step of b) and c) may be performed using separate substrate processing apparatuses 1. In this case, the separate substrate processing apparatuses 1 may share a vacuum transport mechanism and may transport the substrate W without exposing the substrate to the atmosphere.

Among b) and c), step of c) may be performed using the substrate processing apparatus 1, and step of b) may be performed using a chamber having a temperature-adjustable mount and a gas supply for a precursor gas, such as a thermal chemical vapor deposition (CVD) apparatus. In this case, the substrate processing apparatus 1 and the thermal CVD apparatus may share a vacuum transport mechanism and may transport the substrate W without exposing the substrate W to the atmosphere.

As in the present embodiment, each step of b) and c) described above is performed in the same chamber or in the same processing system without being exposed to the atmosphere (while maintaining a vacuum), so that productivity is improved.

Although embodiments of the present disclosure have been described, the present disclosure is not limited to these embodiments, and various modifications and variations are possible within the scope of the claims.

The present application claims priority to Japanese Patent Application No. 2019-224476, filed Dec. 12, 2019, with the Japanese Patent Office. The contents of which are incorporated herein by reference in their entirety.

DESCRIPTION OF THE REFERENCE NUMERAL

1 Substrate processing apparatus
10 Chamber
**10*s*** Processing space
**10*e*** Exhaust port
11 Support
111 Lower electrode
112 Electrostatic chuck
113 Edge ring
12 Upper electrode showerhead
**12*a*** Gas inlet
**12*b*** Gas diffusion chamber
**12*c*** Gas outlet
13 Transmissive window
20 Gas supply
21 Gas source
22 Flow controller
30 RF power supply
**30*a*** First RF power supply
**31*a*** First RF generator
**32*a*** First matching circuit
**30*b*** Second RF power supply
**31*b*** Second RF generator
**32*b*** Second matching circuit
40 Exhaust system
50 Controller
51 Computer
511 Processor
512 Storage
513 Communication interface
60 UV irradiator
W Substrate
R1 First region
R2 Second region

The invention claimed is:

1. A substrate processing method comprising:
a) providing a substrate having a first region on a surface;
b) supplying a precursor to the surface of the substrate, the precursor including at least both a halogen and carbon and being configured to form a first chemical bond in the first region; and
c) exposing the surface of the substrate to a plasma of an inert gas, wherein the precursor includes an alkyl halide having 5 or more and 20 or less carbons.

2. The substrate processing method according to claim 1, wherein the alkyl halide includes at least one unsaturated bond.

3. The substrate processing method according to claim 2, wherein the alkyl halide includes the unsaturated bond in at least one terminal.

4. The substrate processing method according to claim 3, wherein the number of halogen atoms included in the alkyl halide is 0.5 or more and 2 or less per carbon atom included in the alkyl halide.

5. The substrate processing method according to claim 4, further comprising prior to b):
d) irradiating the surface of the substrate with ultraviolet light.

6. The substrate processing method according to claim 5, further comprising between b) and c):
e) purging the surface of the substrate.

7. The substrate processing method according to claim 6,
wherein the substrate further includes a second region on the surface, and
wherein the precursor is configured to form a second chemical bond in the second region, the second chemical bond having lower binding energy compared to the first chemical bond, and
the substrate processing method further comprises after b):
f) supplying energy lower than binding energy of the first chemical bond and higher than binding energy of the second chemical bond to the surface of the substrate.

8. The substrate processing method according to claim 7, wherein in f), a temperature of the surface of the substrate is set to a temperature below a temperature at which the first chemical bond is broken and above a temperature at which the second chemical bond is broken.

9. The substrate processing method according to claim 8, wherein the first region is formed of silicon nitride, and the second region is formed of silicon oxide.

10. The substrate processing method according to claim 9, wherein b) and c) are repeated.

11. The substrate processing method according to claim 10, wherein b) and c) are performed in a vacuum.

12. The substrate processing method according to claim 11, wherein b) and c) are performed in a same chamber or in a same processing system.

13. The substrate processing method according to claim 1, further comprising prior to b):
d) irradiating the surface of the substrate with ultraviolet light.

14. The substrate processing method according to claim 1, further comprising between b) and c):
e) purging the surface of the substrate.

15. The substrate processing method according to claim 1, wherein b) and c) are repeated.

16. The substrate processing method according to claim 1, wherein b) and c) are performed in a vacuum.

17. A substrate processing method comprising:
a) providing a substrate having a first region and a second region on a surface;
b) supplying a precursor to the surface of the substrate, the precursor including at least both a halogen and carbon and being configured to form a first chemical bond in the first region and to form a second chemical bond in the second region, the second chemical bond having lower binding energy compared to the first chemical bond;

f) after b), supplying energy lower than binding energy of the first chemical bond and higher than binding energy of the second chemical bond to the surface of the substrate; and c) exposing the surface of the substrate to a plasma of an inert gas.

* * * * *